United States Patent
Sasaki

(10) Patent No.: US 11,862,885 B2
(45) Date of Patent: Jan. 2, 2024

(54) ELECTRIC CONNECTION MEMBER AND CIRCUIT UNIT

(71) Applicant: Sumitomo Wiring Systems, Ltd., Yokkaichi (JP)

(72) Inventor: Yoshikazu Sasaki, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 15 days.

(21) Appl. No.: 17/527,504

(22) Filed: Nov. 16, 2021

(65) Prior Publication Data

US 2022/0158378 A1 May 19, 2022

(30) Foreign Application Priority Data

Nov. 17, 2020 (JP) ................................ 2020-190995

(51) Int. Cl.
| | |
|---|---|
| *H01R 13/405* | (2006.01) |
| *H01R 25/16* | (2006.01) |
| *H01R 13/504* | (2006.01) |
| *H01R 13/52* | (2006.01) |
| *H01R 43/24* | (2006.01) |

(52) U.S. Cl.
CPC ....... *H01R 13/405* (2013.01); *H01R 13/5045* (2013.01); *H01R 13/5202* (2013.01); *H01R 25/162* (2013.01); *H01R 43/24* (2013.01)

(58) Field of Classification Search
None
See application file for complete search history.

(56) References Cited

U.S. PATENT DOCUMENTS

| | | | | |
|---|---|---|---|---|
| 4,925,400 | A * | 5/1990 | Blair ................ | H01R 13/6485 29/842 |
| 5,205,977 | A * | 4/1993 | Green ............... | H01R 13/504 264/261 |
| 6,428,344 | B1 * | 8/2002 | Reed ................. | H01R 13/504 439/604 |
| 7,723,619 | B2 * | 5/2010 | Ohashi .............. | H01R 43/24 439/736 |
| 8,784,715 | B2 * | 7/2014 | Oohashi ............ | H01R 43/24 264/279 |
| 9,059,534 | B2 * | 6/2015 | Endo ................ | H01R 13/5205 |
| 2020/0350723 | A1 * | 11/2020 | Yamada ........... | B29C 45/0025 |
| 2020/0391413 | A1 * | 12/2020 | Yamada ........... | B29C 45/0046 |

FOREIGN PATENT DOCUMENTS

JP    2005-174697 A    6/2005

* cited by examiner

*Primary Examiner* — Oscar C Jimenez
(74) *Attorney, Agent, or Firm* — Honigman LLP

(57) ABSTRACT

An electric connection member including: a bus bar that has at least one terminal portion; a primary molded portion formed in one piece with the bus bar in a state where the terminal portion is exposed; a secondary molded portion formed in one piece with the primary molded portion; and a seal member embedded in the secondary molded portion, wherein the primary molded portion includes an exposed portion that is exposed from an opening portion provided in the secondary molded portion, the seal member is shaped to surround the circumference of the exposed portion without a gap, and a boundary portion of the seal member to the secondary molded portion is heat sealed to the secondary molded portion.

13 Claims, 19 Drawing Sheets

ELECTRIC CONNECTION MEMBER AND CIRCUIT UNIT

CROSS-REFERENCE TO RELATED APPLICATIONS

This application claims priority of Japanese Patent Application No. JP 2020-190995 filed on Feb. 19, 2016, the contents of which are incorporated herein.

TECHNICAL FIELD

The present disclosure is related to an electric connection member and a circuit unit.

BACKGROUND

For example, the electric connection member disclosed in JP 2005-174697A in which a plurality of terminal fittings are held in a housing is known as a conventional electric connection member. In this electric connection member, once a plurality of terminal fittings have been respectively passed through and held by terminal insertion holes of a core, which is a primary molded part, positioning is performed by fitting one end of each of the terminal fittings into a terminal holding groove of a fixed mold, and fitting the other end of each of the terminal fittings into a terminal holding hole of an upper mold, and secondary molding is performed in this state by pouring a molten resin into a cavity via a gate. Once the molten resin has cooled and solidified, the electric connection member can be obtained by opening the upper mold and removing it from the fixed mold.

SUMMARY

However, in the aforementioned electric connection member, the core is not directly held by the fixed mold or by the upper mold during secondary molding, and thus the core may shift under the injection pressure of the molten resin.

Thus, it is conceivable to directly hold the core by using the fixed mold or the upper mold during molding. The portion of the core directly held by the die is not covered by molten resin during secondary molding, and thus is exposed to the outside. If the core, which is a primary molded part, and a portion formed during secondary molding are in complete intimate contact, there is no concern that water will enter into the electric connection member, even if a portion of the core is exposed to the outside.

However, if there is a gap between the core that is the primary molded part and the portion formed in the secondary molding, there is a concern that water will enter from the gap and the water proofness of the electric connection member will deteriorate.

An electric connection member according to the present disclosure, including: a bus bar that has at least one terminal portion; a primary molded portion formed in one piece with the bus bar in a state where the terminal portion is exposed; a secondary molded portion formed in one piece with the primary molded portion; and seal member embedded in the secondary molded portion, wherein the primary molded portion includes an exposed portion that is exposed from an opening portion provided in the secondary molded portion, the seal member is shaped to surround the circumference of the exposed portion without a gap, and a boundary portion of the seal member to the secondary molded portion is heat sealed to the secondary molded portion.

With the present disclosure, water proofness can be improved.

DETAILED DESCRIPTION OF PREFERRED EMBODIMENTS

Figure 1:
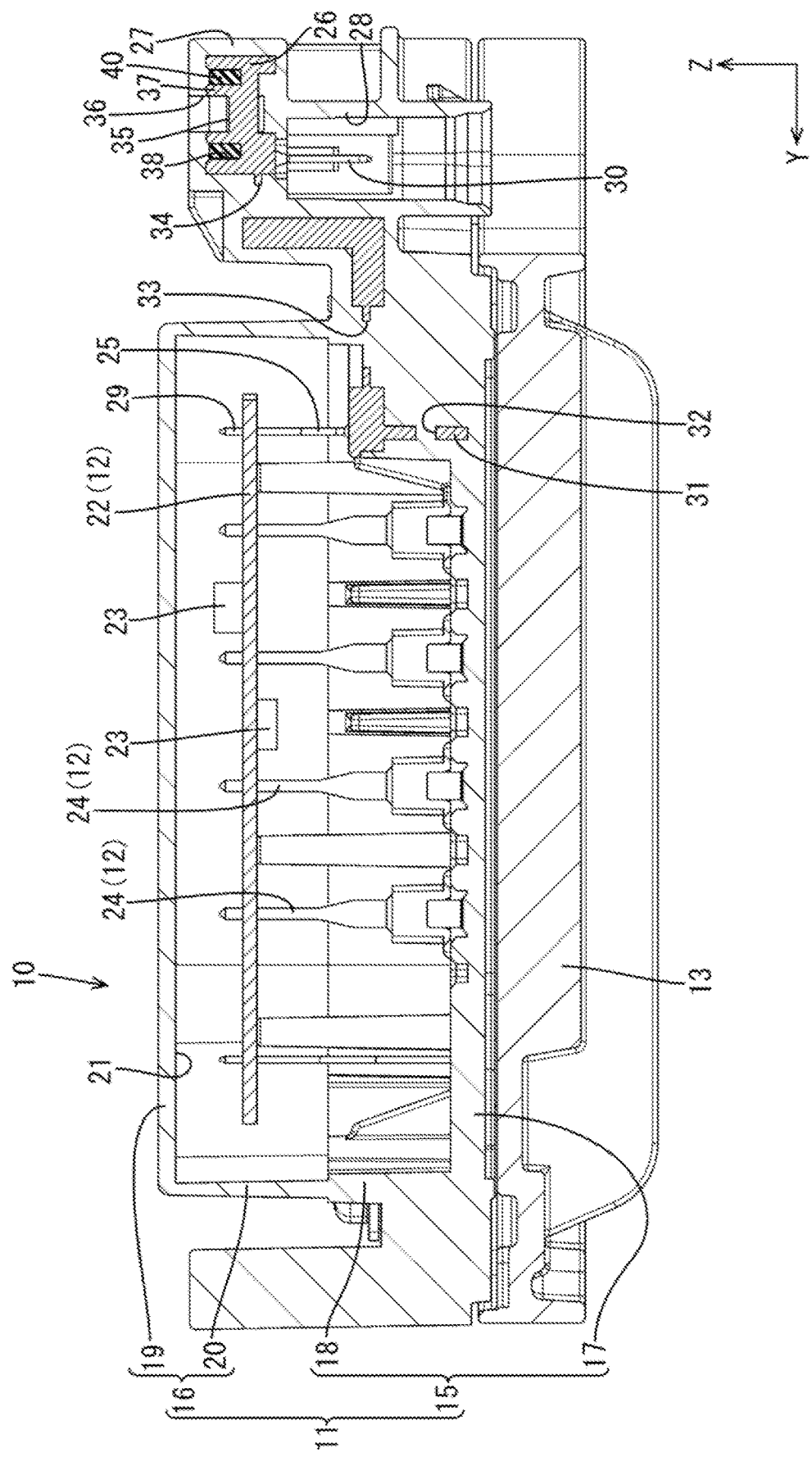
FIG. 1 is a cross-sectional diagram showing a circuit unit according to Embodiment 1, taken along line I-I in FIG. 8.

First, embodiments of the present disclosure are listed and described.

In a first aspect, an electric connection member according to the present disclosure, includes: a bus bar that has at least one terminal portion; a primary molded portion formed in one piece with the bus bar in a state where the terminal portion is exposed; a secondary molded portion formed in one piece with the primary molded portion; and seal member embedded in the secondary molded portion, wherein the primary molded portion includes an exposed portion that is exposed from an opening portion provided in the secondary molded portion, the seal member is shaped to surround the circumference of the exposed portion without a gap, and a boundary portion of the seal member to the secondary molded portion is heat sealed to the secondary molded portion.

When molding the secondary molded portion, the primary molded portion and the bus bar can be kept from shifting as a result of using a die to hold the exposed portion of the primary molded portion during the secondary molding.

Even if water enters from an opening portion of the secondary molded portion and reaches the exposed portion of the primary molded portion, the circumference of the exposed portion is surrounded, without a gap, by the seal member heat sealed to the secondary molded portion, and thus water is kept from moving past the exposed portion and into the secondary molded portion. Accordingly, the water-proofness of the electric connection member can be further improved.

Preferably, in a second aspect of the present disclosure is the electric connection member according to (1), wherein the primary molded portion has a housing cavity that is formed in the shape of a recess and surrounds the circumference of the exposed portion, and the seal member is disposed in the housing cavity.

By performing the simple procedure of fitting the seal member into the housing cavity, the seal member can be attached to the primary molded portion, and thus the manufacturing process of the electric connection member can be made more efficient.

Preferably, in a third aspect of the present disclosure is the electric connection member according to (2), wherein one of the seal member and a wall surface of the housing cavity is provided with a press-fitting rib protruding toward the other of the seal member and the wall surface of the housing cavity, and the press-fitting rib comes into contact with the other of the seal member and the wall surface of the housing cavity.

The seal member is firmly held against the wall surface of the housing cavity by the press-fitting rib. Accordingly, when molding the secondary molded portion, the seal member can be kept from coming loose from the primary molded portion.

Preferably, in a fourth aspect of the present disclosure is the electric connection member according to any one of aspects described above, wherein the bus bar has at least two end portions, the two end portions are each provided with a terminal portion, and the exposed portion is provided in a portion of the primary molded portion that is different to where the terminal portions of the two end portions are provided.

At least two terminal portions and the exposed portion can be held by the die, and thus the primary molded portion and the bus bar can be further kept from shifting when the secondary molded portion is molded.

Preferably, in a fifth aspect of the present disclosure is the electric connection member according to the fourth aspect, wherein the terminal portions respectively provided at the two end portions extend in opposite directions relative to a plate surface of the bus bar, and the exposed portion and the terminal portion of the terminal portions respectively provided at the two end portions closer to the exposed portion are disposed on opposite sides relative to the plate surface of the bus bar.

When molding the secondary molded portion, the primary molded portion can be kept from being subjected to an angular moment by the molten synthetic resin.

A circuit unit according to a sixth aspect of the present disclosure, including: a case including the electric connection member according to any one of the first to fifth aspects; and a circuit portion housed in the case.

Preferably, in a seventh aspect of the present disclosure is a circuit unit according to the sixth aspect, wherein the terminal portion includes an inner terminal portion disposed in the case and connected to the circuit portion, and an outer terminal portion disposed outside of the case and configured to be connected to an external circuit.

The external circuit disposed outside of the case and the circuit portion inside the case can be electrically connected in a state where water-proofness is maintained by the electric connection member of the case.

Embodiments of the present disclosure will be described below. The present disclosure is not limited to these examples, and is intended to include all modifications that are indicated by the claims and are within the meaning and scope of equivalents of the claims.

Embodiment 1

Embodiment 1 of the present disclosure will be described with reference to FIGS. 1 to 12. A circuit unit 10 is disposed on a power supply path between a power source such as a battery in vehicles including electric vehicles, hybrid vehicles, and gasoline-powered vehicles and a load realized by a vehicle-mounted electrical component such as a lamp or a driving motor. The circuit unit 10 can be disposed in any orientation, but in the following description, the direction indicated by the X arrow is the left direction, the direction indicated by the Y arrow is the forward direction, and the direction indicated by the Z arrow is the upward direction. When there is more than one of the same members, reference numerals may be given only to some of the members and omitted from other members.

Circuit Unit 10

As shown in FIG. 1, the circuit unit 10 is provided with a case 11 and a circuit portion 12 housed in the case 11. A heat dissipating member 13 that dissipates heat from the circuit unit 10 is attached to the lower side of the case 11.

Heat Dissipating Member 13

Figure 2:
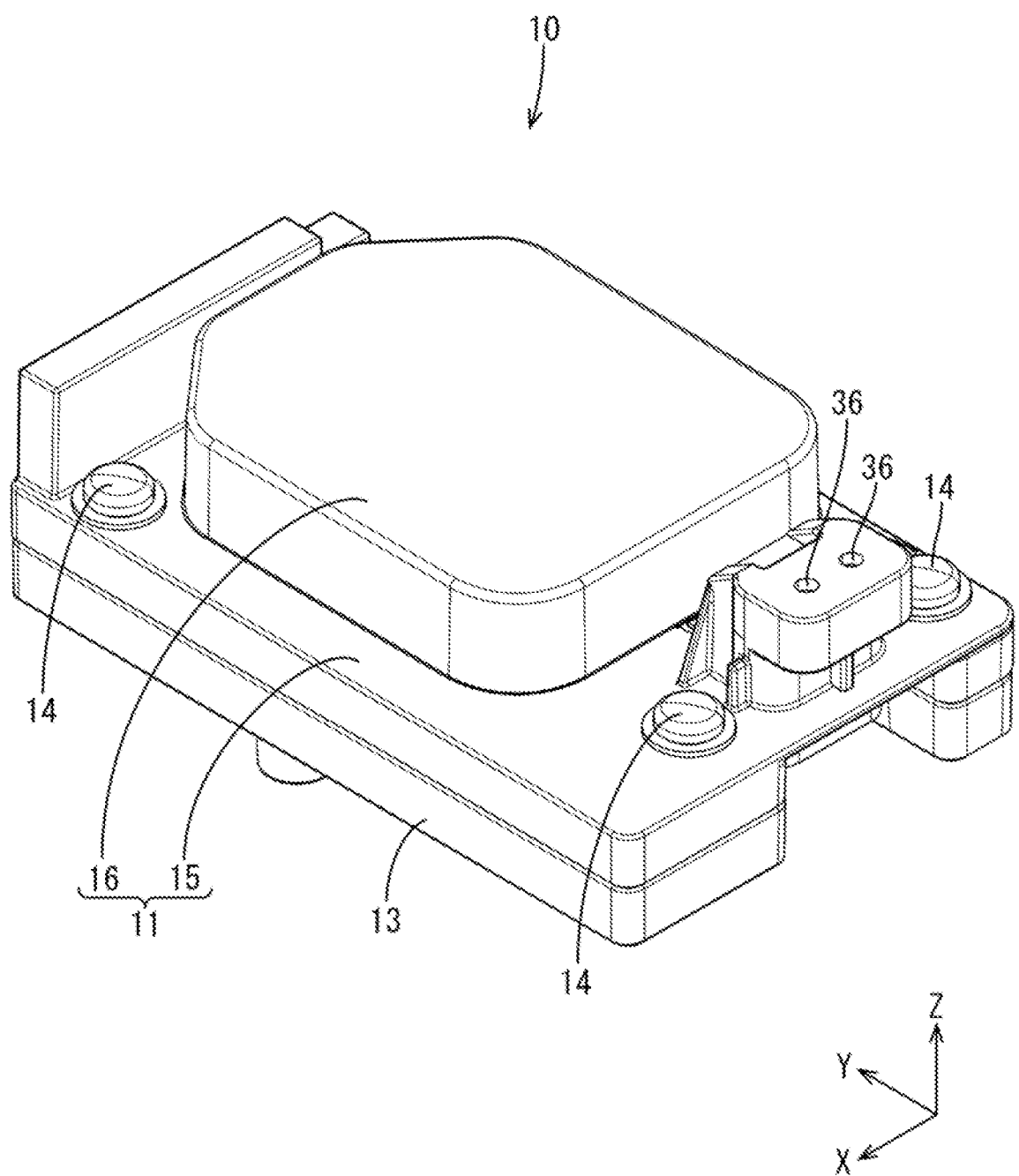
FIG. 2 is a perspective view showing the circuit unit.

The heat dissipating member 13 is formed into a plate shape and is made of a metal material with high thermal conductivity such as aluminum, an aluminum alloy, copper, or a copper alloy. As shown in FIG. 2, the heat dissipating member 13 and the case 11 are screwed together using bolts 14.

Case 11

As shown in FIG. 1, for the case 11, a lower case 15 and an upper cover 16 that closes off the upper side of the lower case 15 are joined in a liquid-proof state through heat sealing. In the present embodiment, the lower case 15 and the upper cover 16 are ultrasonically welded to each other. The lower case 15 and the upper cover 16 are integrated into a state where the lower case 15 and the upper cover 16 are joined to each other, and thus the lower case 15 and the upper cover 16 are marked with the same hatching in FIG. 1.

As shown in FIG. 1, the lower case 15 includes a bottom wall 17 and a side wall 18 that extends upward from the side edge of the bottom wall 17. The upper cover 16 includes an upper wall 19 and a side wall 20 that extends downward from the side edge of the upper wall 19. The upper edge of the side wall 18 of the lower case 15 and the lower end edge of the side wall 20 of the upper cover 16 have the same shape, and as described above, are integrally joined through heat sealing.

As shown in FIG. 1, a circuit board 22 (an example of the circuit portion 12) is housed in a housing space 21 formed between the lower case 15 and the upper cover 16. A conductive path (not shown) is provided on the circuit board 22 by using a known printed wiring technique. Electronic devices 23 are disposed on the upper and lower sides of the circuit board 22. The electronic devices 23 may be soldered to the conductive path. The electronic devices 23 are semiconductor relays such as field effect transistors (FETs). The electronic devices 23 are not limited to semi-conductor relays, and may also be mechanical relays, resistors, coils, capacitors, or the like. A configuration may also be employed in which only the upper side or the lower side of the circuit board 22 is provided with electrical devices 23.

As shown in FIG. 1, connection terminals 24 (examples of the circuit portion 12) extending upward from the bottom wall 17 of the lower case 15 are disposed in the housing space 21. The upper end portion of the connection terminals 24 passes through the circuit board 22 and extends to the upper side of the circuit board 22. The connection terminals 24 and the conductive path of the circuit board 22 are soldered to each other.

Lower Case 15

As shown in FIG. 1, the lower case 15 includes a plurality (four in the present embodiment) of bus bars 25, a primary molded portion 26 formed around the bus bars 25, and a secondary molded portion 27 formed around the primary molded portion 26. The rear end portion of the lower case 15 is provided with a connector portion 28 (an example of an electric connection member) that is open downward. The connector portion 28 is configured to be fitted to an external connector (not shown).

Figure 3:
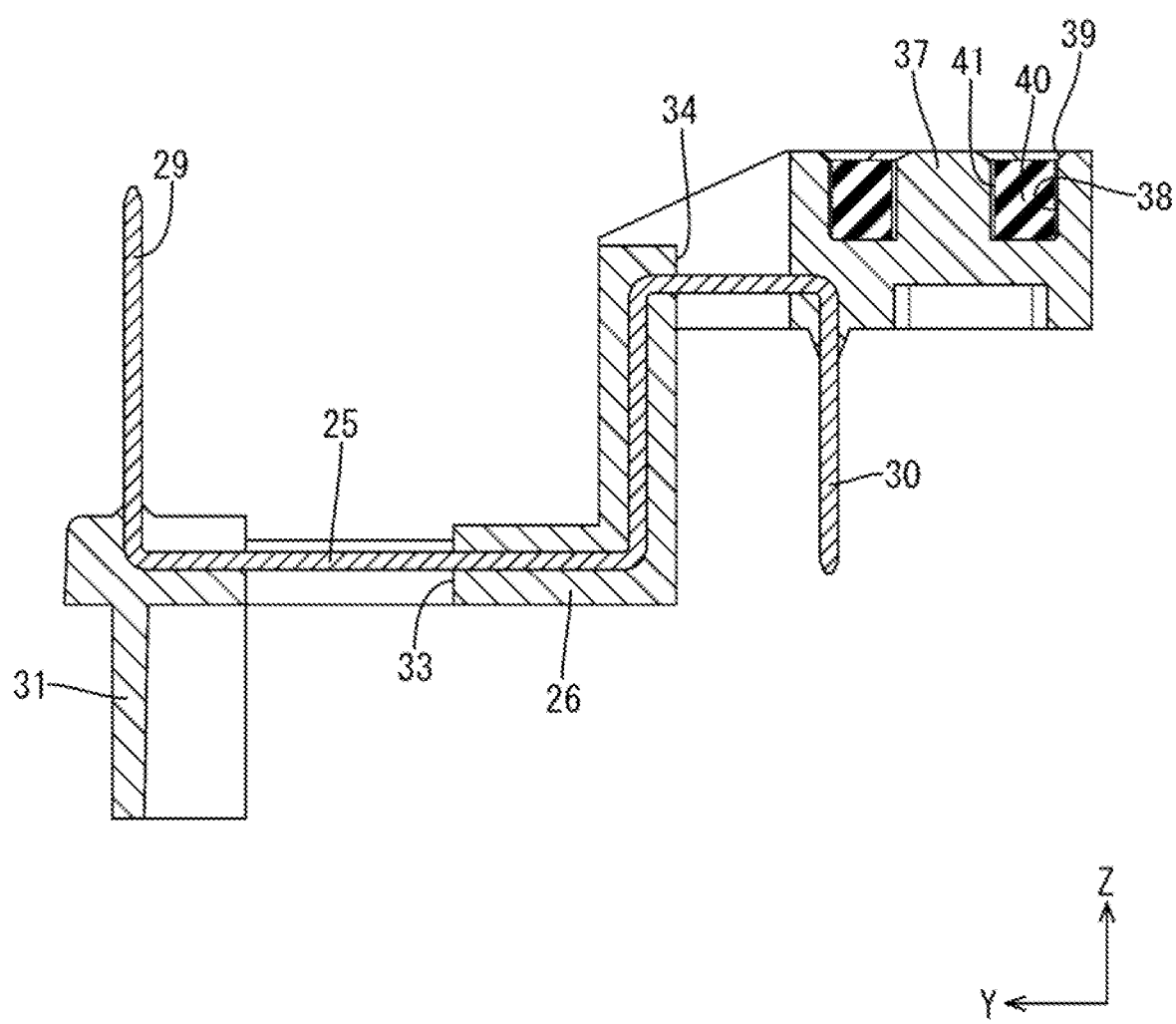
FIG. 3 is a cross-sectional diagram showing a primary molded portion, taken along line in FIG. 5.

As shown in FIG. 3, the bus bars 25 are formed by pressing a metal plate material into a predetermined shape. Each bus bar 25 is formed approximately into an S shape in a side view. As the metal forming the bus bars 25, copper, a copper alloy, aluminum, an aluminum alloy, or the like can be selected as suitable. In the present embodiment, the bus bars 25 are made of copper or a copper alloy. The surface of each bus bar 25 may be provided with a plating layer. As the metal forming the plating layer, tin, solder, nickel, or the like can be selected as suitable.

As shown in FIG. 1, the front end portion of each bus bar 25 is an inner terminal portion 29 (an example of a terminal portion) that extends upward in the housing space 21 of the case 11. The upper end portion of each inner terminal portion 29 passes through the circuit board 22 and extends to the upper side of the circuit board 22. The inner terminal portions 29 and the conductive path of the circuit board 22 are soldered to each other.

The rear end portion of each bus bar 25 is an outer terminal portion (an example of a terminal portion) 30 that is disposed extending downward inside the connecter portion 28, and is electrically connected to an external circuit as a result of the connector portion 28 being connected to an external connector.

Primary Molded Portion 26

As shown in FIG. 3, the primary molded portion 26, which is made of an insulating thermoplastic resin, is formed in one piece with and surrounding the bus bars 25. As the thermoplastic resin forming the primary molded portion 26, polyphenylene sulfide (PPS), polybutylene terephthalate (PBT), nylon, polypropylene (PP), polyethylene (PE), and the like can be selected as suitable. The thermoplastic resin forming the primary molded portion 26 may contain a filler such as glass fibers, talc, mica, or the like.

Figure 4:
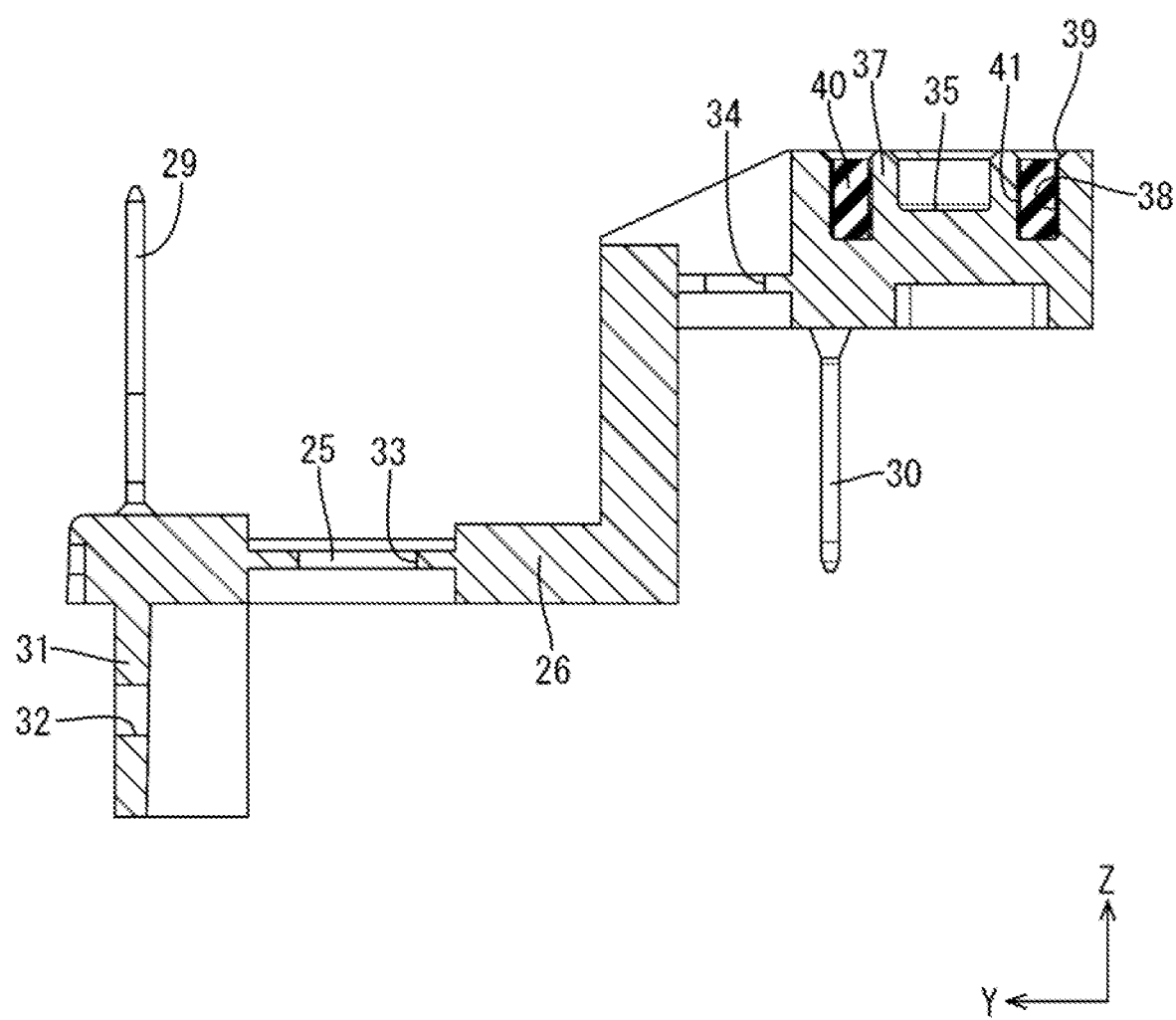
FIG. 4 is a cross-sectional diagram showing the primary molded portion, taken along line IV-IV in FIG. 5.

As shown in FIG. 4, the front end portion of the primary molded portion 26 is provided with a downward protruding portion 31 that extends downward at a position corresponding to the inner terminal portions 29 of the bus bars 25. The downward protruding portion 31 is provided with a lower through-hole 32 extending therethrough in the front-rear direction. Front-side through-holes 33 extending in the vertical direction are provided at positions slightly reward of the downward protruding portion 31. The bus bars 25 are exposed from the front-side through-holes 33.

As shown in FIG. 4, at a position near the rear end portion of the primary molded portion 26, rear-side through-holes 34 extending in the vertical direction are provided at positions slightly forward of the outer terminal portions 30 of the bus bars 25. The bus bars 25 are exposed from the rear-side through-holes 34.

Figure 5:
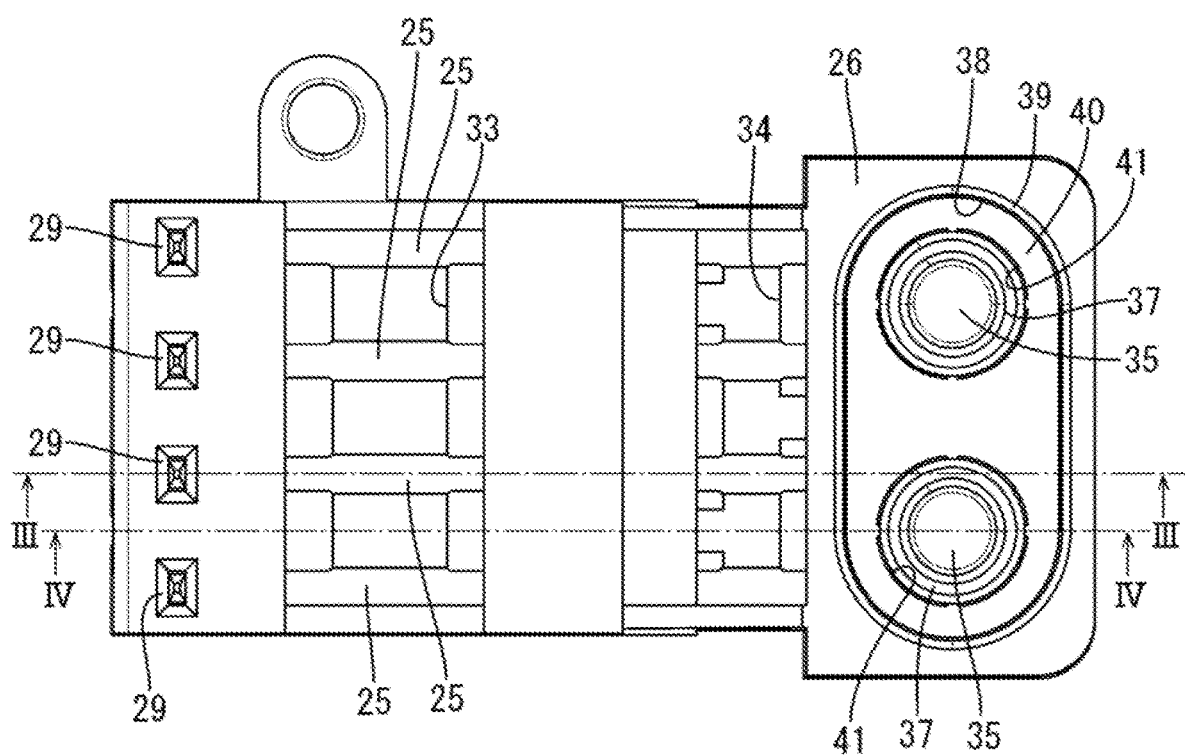
FIG. 5 is a plan view showing the primary molded portion to which a seal member is attached.
Figure 5:
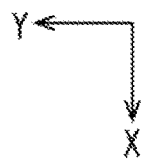
Figure 6:
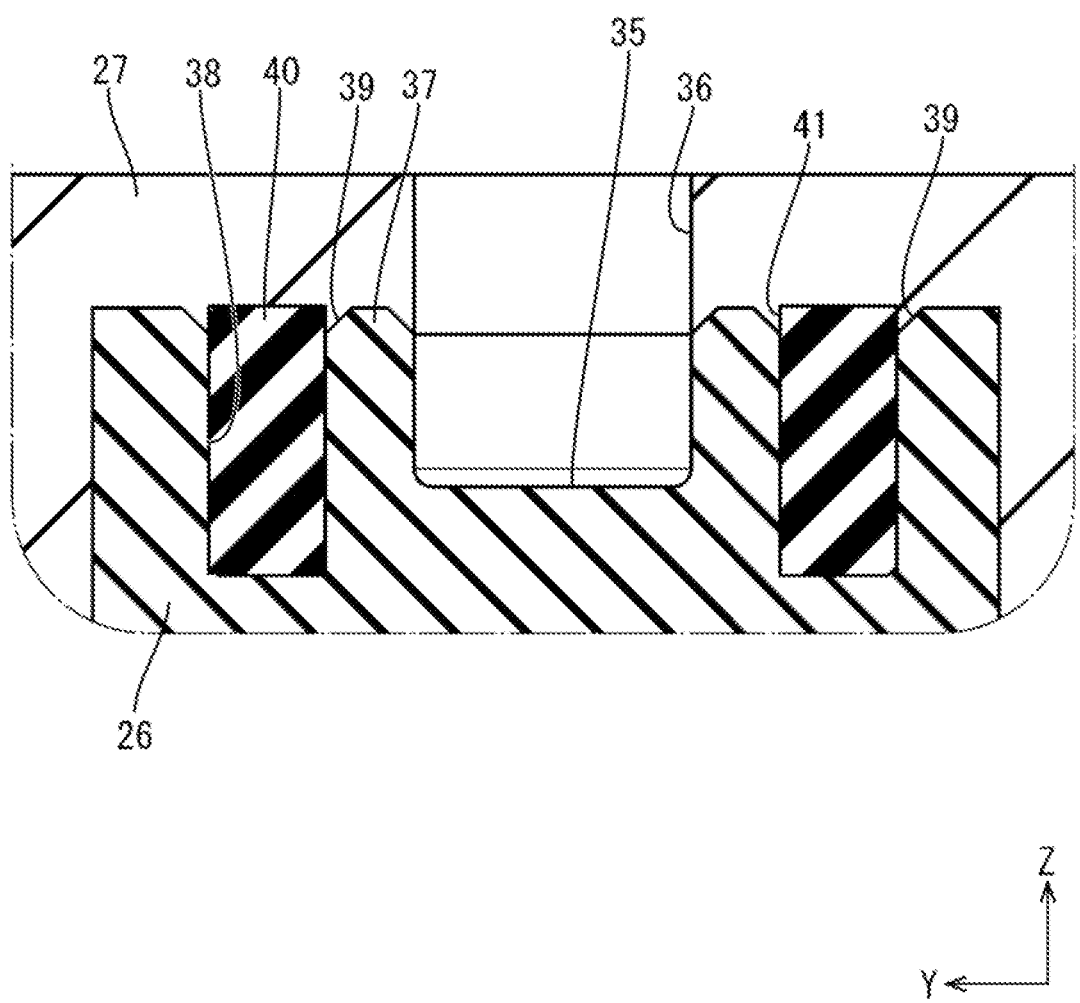
FIG. 6 is a partial enlarged cross-sectional view showing a boundary portion between the seal member and a secondary molded portion.

As shown in FIG. 5, a plurality (two in the present embodiment) of exposed portions 35 depressed downward in the form of cavities are provided in the upper side of the primary molded portion 26 at positions near the rear end portion of the primary molded portion 26 and rearward of the outer terminal portions 30 of the bus bars 25. The exposed portions 35 each have a circular shape as seen from above. As shown in FIG. 6, the bottom surface and the inner wall surface of each exposed portion 35 are exposed to the outside from a corresponding opening portion 36 formed in the secondary molded portion 27. Circumferential walls 37 respectively surrounding the exposed portions 35 are formed extending upward around each exposed portion 35.

Figure 7:
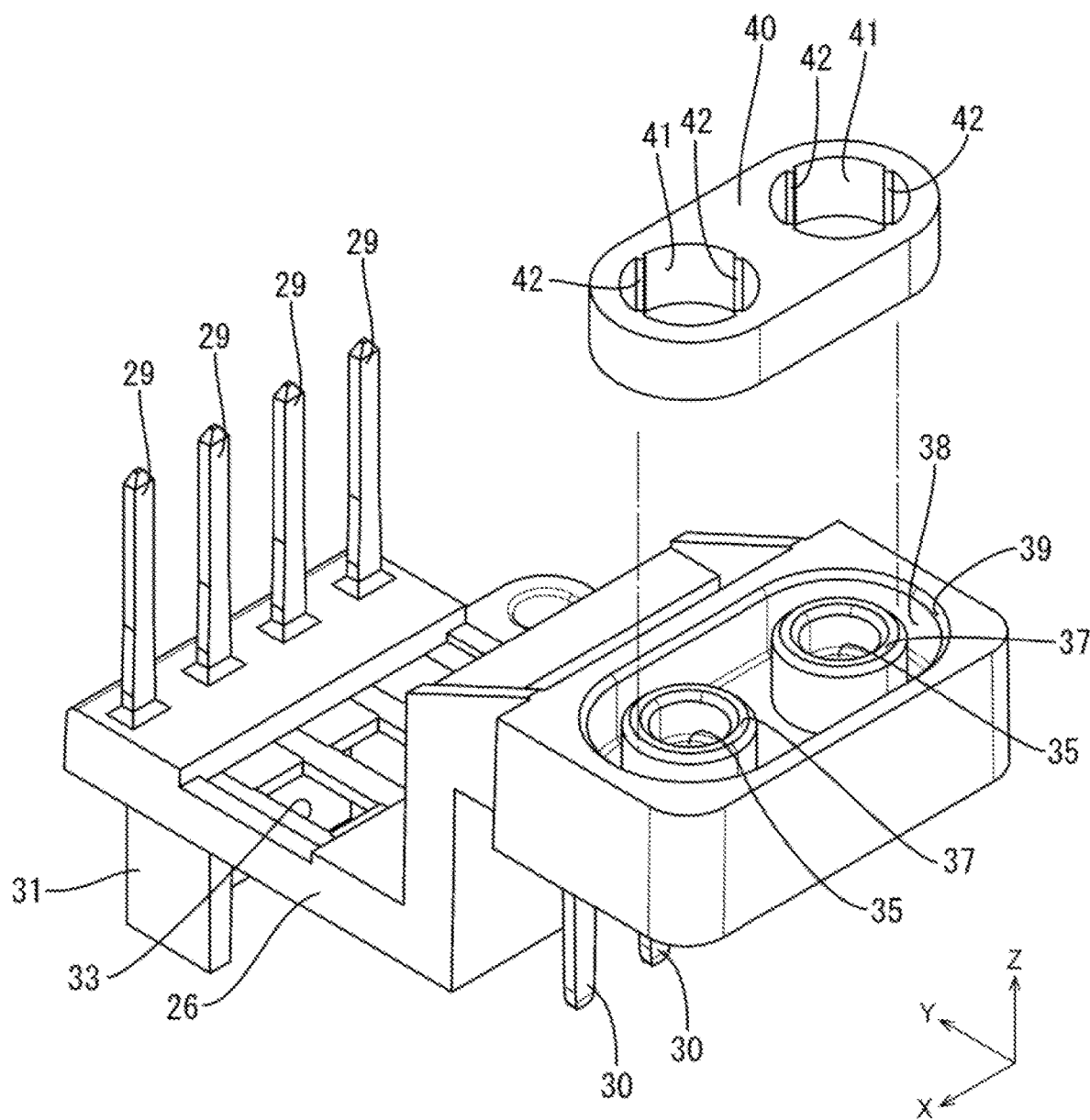
FIG. 7 is an exploded perspective view showing the primary molded portion and the seal member.

As shown in FIG. 7, the upper side of the primary molded portion 26 is provided with a housing cavity 38 formed by depressing a portion outward of each circumferential wall 37 downward. The outer wall surfaces of the circumferential walls 37 form wall surfaces of the housing cavity 38. The housing cavity 38 is formed around the two exposed portions 35. The hole edge portion of the housing cavity 38 has a racetrack shape that is elongated in the left-right direction, as seen from above. The upper edge of the housing cavity 38 is provided with an inclined surface 39 that is inclined upward and outward.

Seal Member 40

As shown in FIG. 6, a seal member 40 is housed in the housing cavity 38 of the primary molded portion 26. The seal member 40 is made of a thermoplastic elastomer resin. A polyester-based elastomer resin can be used as the elastomer resin forming the seal member 40, for example.

As shown in FIG. 7, the outer shape of the seal member 40 matches the inner shape of the housing cavity 38, and has a racetrack shape that is elongated in the left-right direction. The seal member 40 is provided with a plurality (two in the present embodiment) of through-holes 41 extending therethrough in the vertical direction and spaced apart from each other in the left-right direction. The inner shape of the through-holes 41 is substantially the same as the outer shape of the circumferential walls 37. The inner wall surface of each through-hole 41 is provided with a plurality of press-fitting ribs 42 that extend in the vertical direction and are spaced apart from each other in the circumferential direction of the through-hole 41. In the present embodiment, four press-fitting ribs 42 are equidistantly spaced apart from each other. The press-fitting ribs 42 are configured to abut against the outer wall surface (wall surface of the housing cavity 38) of the corresponding circumferential wall 37. Accordingly, the seal member 40 is held in the housing cavity 38.

In a state where the seal member 40 is fitted into the housing cavity 38, the exposing portions 35 are surrounded by the seal member 40 without a gap in the circumference thereof.

Secondary Molded Portion 27

As shown in FIG. 1, the secondary molded portion 27, which is made of an insulating thermoplastic resin, is formed in one piece with the primary molded portion 26, surrounding the primary molded portion 26 and the seal member 40. The seal member 40 is embedded in the secondary molded portion 27.

As the thermoplastic resin forming the secondary molded portion 27, polyphenylene sulfide (PPS), polybutylene terephthalate (PBT), nylon, polypropylene (PP), polyethylene (PE), and the like can be selected as suitable. The thermoplastic resin forming the secondary molded portion 27 may contain a filler such as glass fibers, talc, mica, or the like.

In the present embodiment, the secondary molded portion 27 is made of the same thermoplastic resin forming the primary molded portion 26. In the present embodiment, the melting point of the thermoplastic resin forming the secondary molded portion 27 is higher than the melting point of the thermoplastic elastomer forming the seal member 40.

It is preferable that the thermoplastic resin forming the secondary molded portion 27 has high affinity to the thermoplastic resin forming the primary molded portion 26. Also, it is preferable that the thermoplastic resin forming the secondary molded portion 27 has high affinity to the thermoplastic elastomer resin forming the seal member 40.

Figure 8:
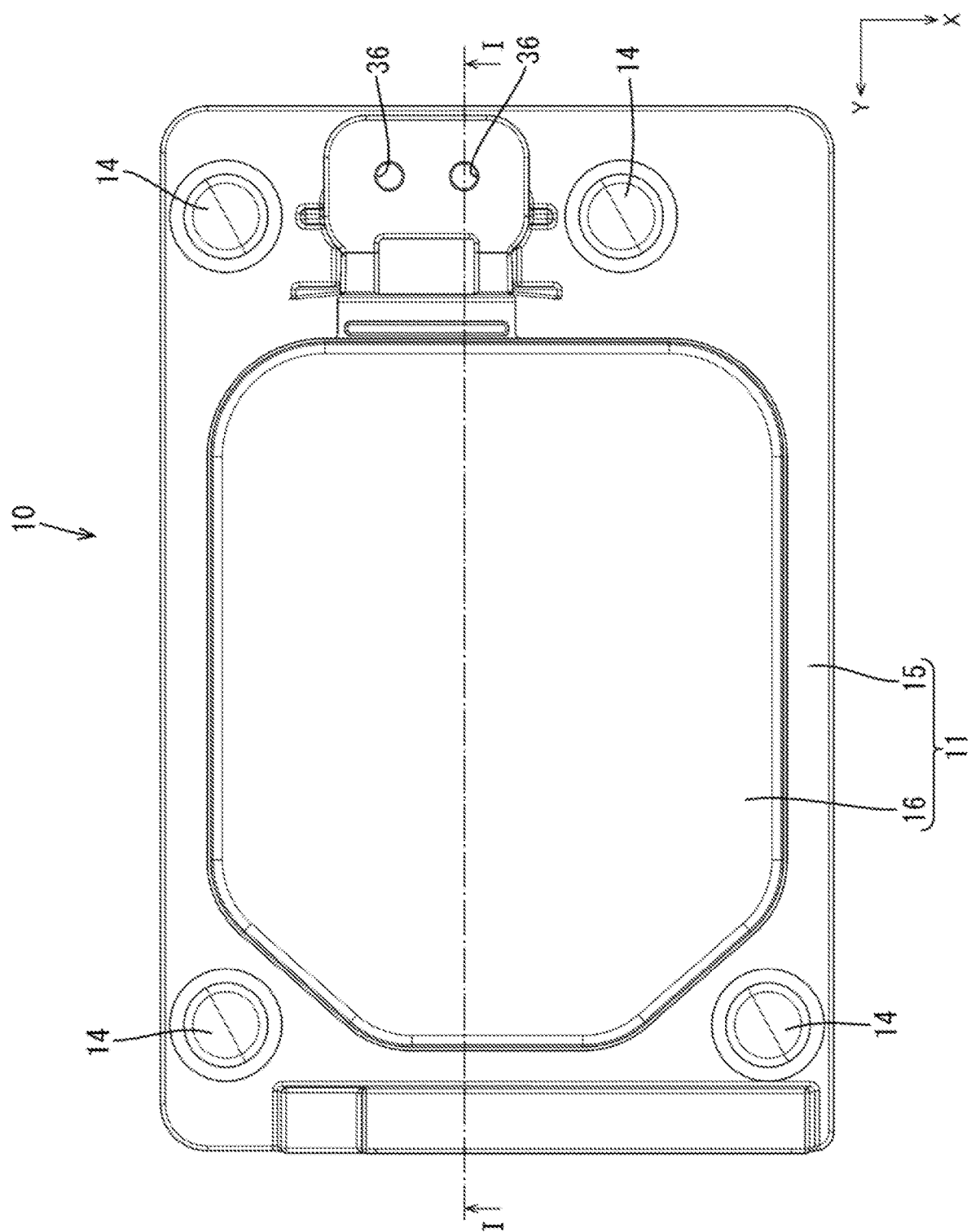
FIG. 8 is a plan view showing the circuit unit.

As shown in FIG. 8, the opening portions 36 that are open upward are formed on the upper side of the secondary molded portion 27 at positions near the rear end portion and corresponding to the exposed portions 35 of the primary molded portion 26. The inner shape of each opening portion 36 is a circular shape as seen from above. The exposed portions 35 of the primary molded portion 26 are exposed upward in the opening portions 36. As shown in FIG. 6, the inner wall surfaces of the opening portions 36 are formed flush with the inner wall surfaces of the circumferential walls 37.

As shown in FIG. 1, the secondary molded portion 27 is filled into the lower through-hole 32, the front-side through-holes 33, and the rear-side through-holes 34 of the primary molded portion 26. Accordingly, the secondary molded portion 27, the primary molded portion 26, and the bus bars 25 are firmly fixed.

As shown in FIG. 1, the connector portion 28, which is open downward, is formed at a position near the rear end portion of the secondary molded portion 27 and corresponding to the outer terminal portions 30 of the bus bars 25. The outer terminal portions 30 are arranged in the connector portion 28. The connector portion 28 is configured to be fitted to an external connector (not shown). By fitting the external connector to the connector portion 28, the outer terminal portions 30 of the bus bars 25 are electrically connected to an external circuit.

Manufacturing Process of Circuit Unit 10

An example of the manufacturing process of the circuit unit 10 according to the present embodiment is described below. Note that the manufacturing process of the circuit unit 10 is not limited to the following description.

A metal plate material is pressed to form the bus bars 25 with a predetermined shape.

The bus bars 25 are placed in an un-shown die, and primary molding is performed by pouring a thermoplastic resin into the die. Thus the primary molded portion 26 is formed (see FIG. 7).

Figure 9:
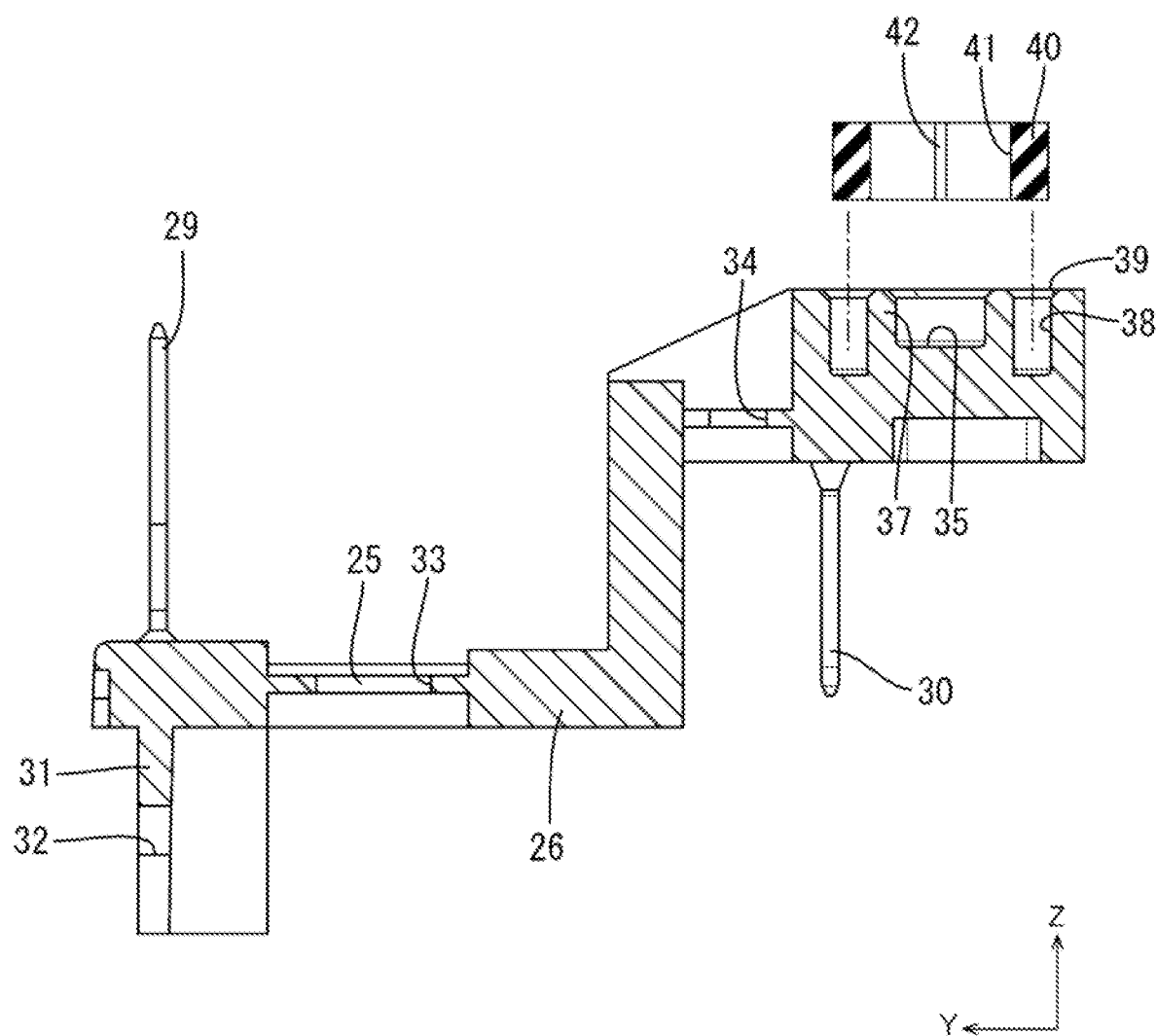
FIG. 9 is a cross-sectional view showing a step of attaching the seal member to the primary molded portion

As shown in FIG. 9, the seal member 40 is press fitted into the housing cavity 38 of the primary molded portion 26 from above. As a result of the press-fitting ribs 42 provided in the through-holes 41 of the seal member 40 abutting against the outer wall surfaces (wall surfaces of the housing cavity) of the circumferential walls 37, the seal member 40 is held in the housing cavity 38.

Figure 10:
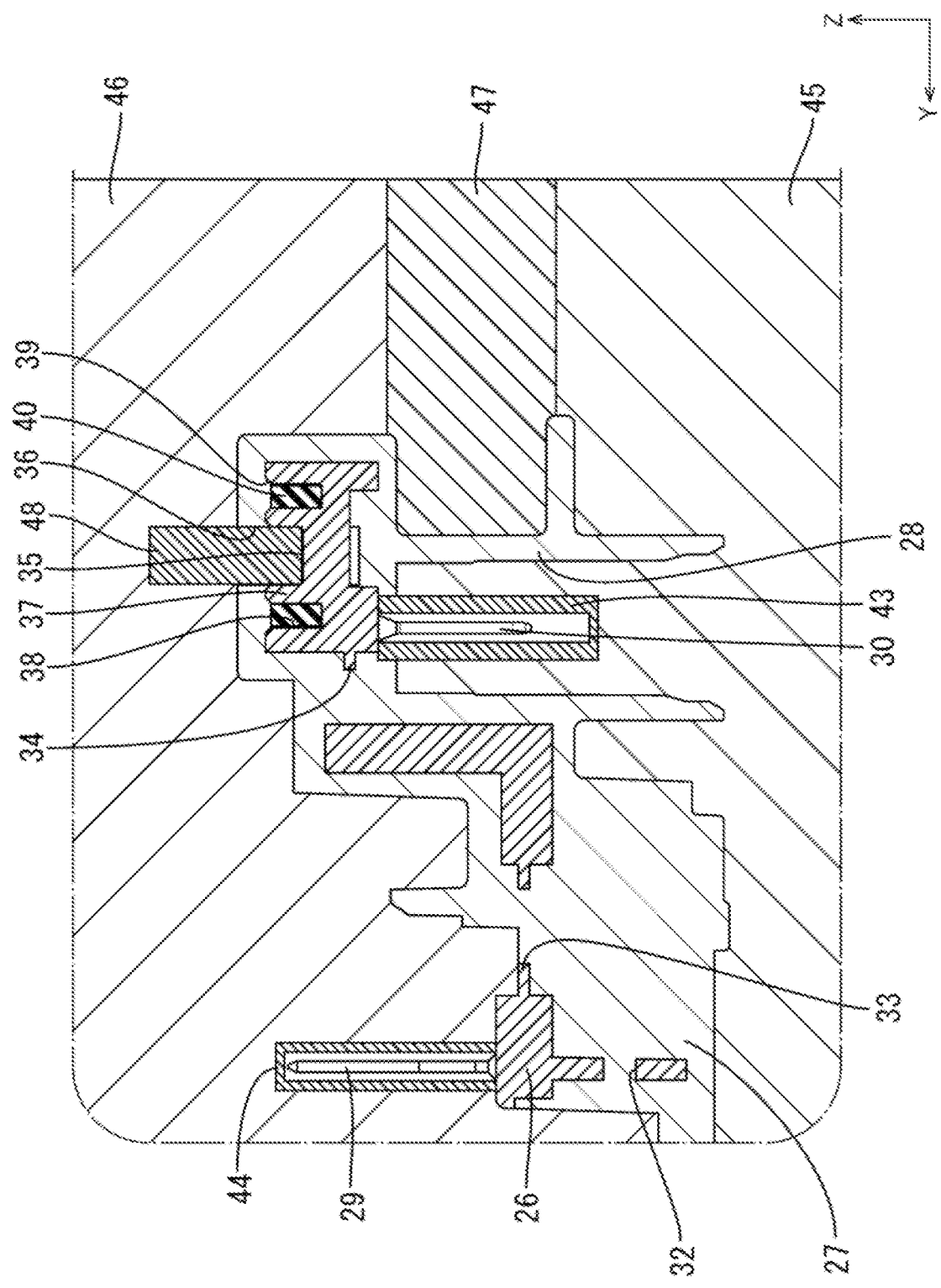
FIG. 10 is a cross-sectional diagram showing a secondary molding step.
Figure 11:
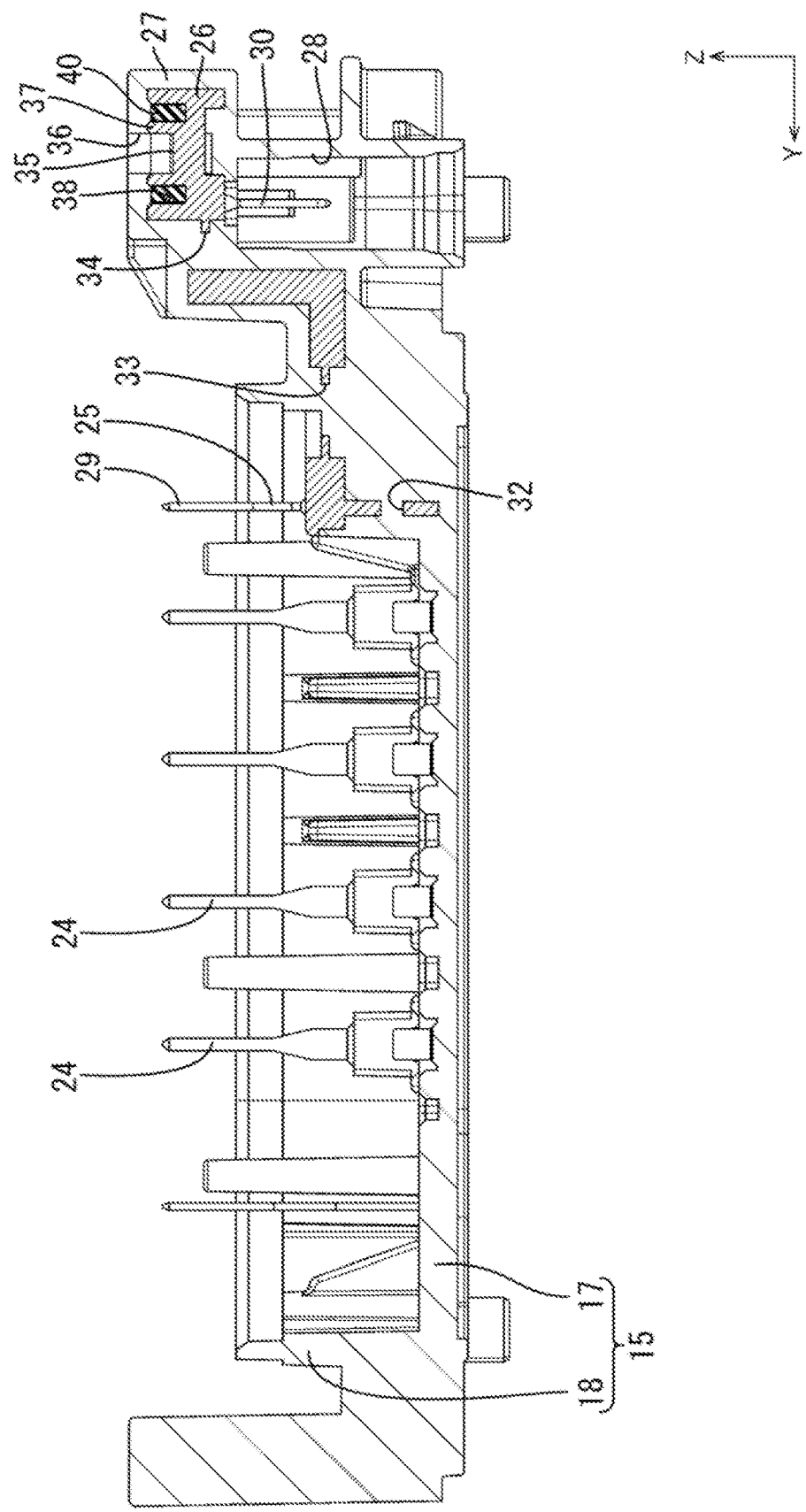
FIG. 11 is a cross-sectional diagram showing a lower case.
Figure 12:
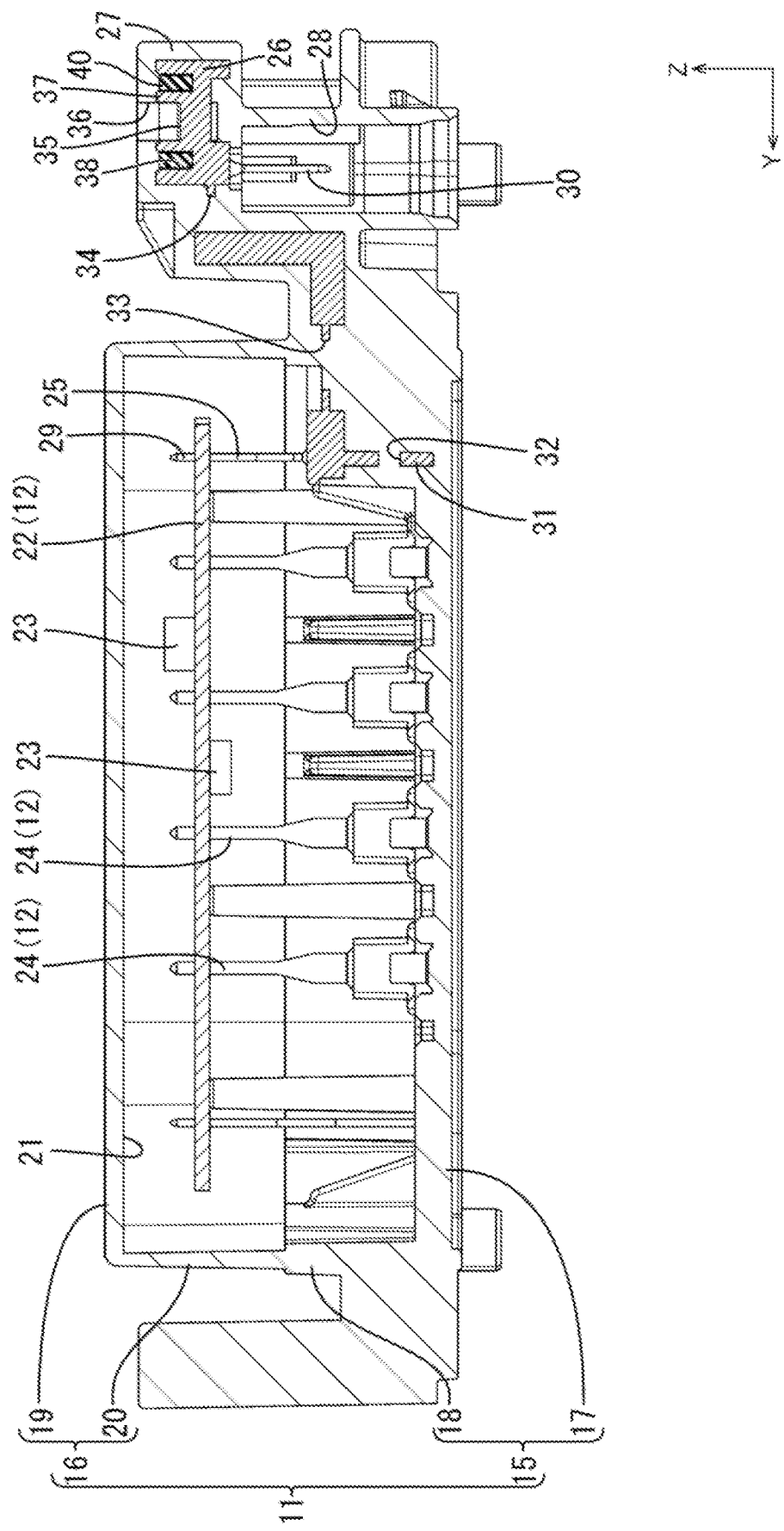
FIG. 12 is a cross-sectional diagram showing the lower case and an upper cover joined to each other.

As shown in FIG. 10, the primary molded portion 26 is placed in a lower mold 45. The lower mold 45 is provided with an outer terminal portion holding portion 43 that is open upward. The outer terminal portions 30 of the primary molded portion 26 are inserted into the outer terminal portion holding portion 43 from above. The upper end portion of the outer terminal portion holding portion 43 is configured to abut against the lower side of the primary molded portion 26 from below. Accordingly, the thermoplastic resin forming the secondary molded portion is kept from flowing into the connector portion 28. Note that, in the present embodiment, the outer terminal portion holding portion 43 is described as being configured separate from the lower mold 45, but the outer terminal portion holding portion 43 and the lower mold 45 may be formed in one piece.

An upper mold 46 is brought toward the primary molded portion 26 placed in the lower mold 45 from above and a sliding mold 47 is brought toward the primary molded portion 26 from the rear side.

The upper mold 46 is provided with an inner terminal portion holding portion 44 that is open downward. The inner terminal portions 29 of the primary molded portion 26 are inserted into the inner terminal portion holding portion 44 from below. The lower end portion of the inner terminal portion holding portion 44 is configured to abut against the upper side of the primary molded portion 26 from above. Accordingly, the thermoplastic resin forming the secondary molded portion is kept from adhering to the inner terminal portions 29.

The upper mold 46 is provided with support portions 48 that protrude downward. Each support portion 48 has a columnar shape extending downward. The outer diameter of the support portions 48 is set to be the same as the inner diameter of an exposed portion 35. The support portions 48 are inserted into the exposed portions 35 from above, respectively. The lower end portions of the support portions 48 are configured to abut against the bottom surface of the exposed portions 35 from above, respectively. The side surfaces of the support portions 48 may abut against the inner wall surfaces of the exposed portions 35. Accordingly, the primary molded portion 26 is kept from being shifted by molten thermoplastic resin during the secondary molding. Note that, in the present embodiment, the inner terminal portion holding portion 44 and the support portions 48 are described as being configured separate from the upper mold 46, but the inner terminal portion holding portion 44 and the support portions 48 may be formed in one piece with the upper mold 46.

Secondary molding is performed by pouring a molten thermoplastic resin into the lower mold 45, the upper mold 46, and the sliding mold 47. The melting point of the thermoplastic resin forming the secondary molded portion 27 is higher than the melting point of the thermoplastic elastomer forming the seal member 40, and thus portions of the seal member 40 that come into contact with the thermoplastic resin melt. Then, the thermoplastic resin forming the secondary molded portion 27 is left to cool to solidify. In doing so, the boundary portion between the seal member 40 and the secondary molded portion 27 is heat sealed. As a result, the portions where the seal member 40 and the secondary molded portion 27 came into contact with each other are heat sealed and integrated with each other.

Also, in the present embodiment, the same material is used for the thermoplastic resin forming the primary molded portion 26 and the thermoplastic resin forming the secondary molded portion 27, and thus, when a molten thermoplastic resin is poured into the lower mold 45, the upper mold 46, and the sliding mold 47 and the molten thermoplastic resin comes into contact with the surface of the primary molded portion 26, the surface of the primary molded portion 26 is melted. Then, by leaving the molten thermoplastic resin to cool, the thermoplastic resin forming the secondary molded portion 27 is solidified. Accordingly, the surface of the primary molded portion 26 and the secondary molded portion 27 are integrated with each other. In this way, the secondary molded portion 27 and the lower case 15 are formed (see FIG. 11).

The connection terminals 24 are attached to the lower case 15. The circuit board 22 on which the electronic devices 23 are mounted is soldered to the connection terminals 24 and the inner terminal portions 29.

The upper cover 16 is formed through injection molding using a thermoplastic synthetic resin. By performing ultrasonic vibration in a state in which the lower end edge of the side wall of the upper cover 16 and the upper edge of the side wall of the lower case 15 are in contact with each other, the upper cover 16 and the lower case 15 are heat sealed to each other (see FIG. 12).

The lower case 15 and the heat dissipation member 13 are screwed together using bolts 14. Accordingly, the circuit unit 10 is complete (see FIG. 2).

Operative Effects of the Present Embodiment

Operative effects of the present embodiment will be described below. The connector portion 28 according to the present embodiment includes: bus bars 25 that each have an inner terminal portion 29 and an outer terminal portion 30; a primary molded portion 26 formed in one piece with the bus bars 25 in a state where the inner terminal portions 29 and the outer terminal portions 30 are exposed; a secondary molded portion 27 formed in one piece with the primary molded portion 26; and a seal member 40 embedded in the secondary molded portion 27. The primary molded portion 26 includes exposed portions 35 respectively exposed from opening portions 36 provided in the secondary molded portion 27, the seal member 40 is shaped to surround the circumference of the exposed portions 35 without a gap, and a boundary portion between the seal member 40 and the secondary molded portion 27 is heat sealed to the secondary molded portion 27.

The circuit unit 10 according to the present embodiment is provided with a case 11 that has the connector portion 28 and a circuit portion 12 housed in the case 11.

As a result of holding the exposed portions 35 of the primary molded portion 26 by using a die when molding the secondary molded portion 27, the primary molded portion 26 and the bus bars 25 are kept from being shifted during the secondary molding.

Even if water enters through an opening portion 36 of the secondary molded portion 27 and reaches an exposed portion 35 of the primary molded portion 26, the circumference of the exposed portion 35 is surrounded, without a gap, by the seal member 40 that is thermally sealed to the secondary molded portion 27, and thus water is kept from moving past the exposed portion 35 and into the secondary molded portion 27. Thus, the water proofness of the electric connection member can be improved.

With the present embodiment, the primary molded portion 26 includes the housing cavity 38 that is formed in the shape of a recess and surrounds the circumference of the exposed portions 35, and the seal member 40 is disposed in the housing cavity 38.

By performing the simple procedure of fitting the seal member 40 into the housing cavity 38, the seal member 40 can be attached to the primary molded portion 26, and thus the manufacturing process of the electric connection member can be made more efficient.

With the present embodiment, the inner walls of the through-holes 41 of the seal member 40 are provided with press-fitting ribs 42 that protrude inward in the through-holes 41, and the press-fitting ribs 42 come into contact with the inner walls of the housing cavity 38.

The seal member 40 is firmly held in the housing cavity 38 by the press-fitting ribs 42. Accordingly, when molding the secondary molded portion 27, the seal member 40 can be kept from coming loose from the primary molded portion 26.

According to the present embodiment, each bus bar 25 has two end portions, and the two end portions are respectively provided with an inner terminal portion 29 and an outer terminal portion 30, and the exposed portions 35 are provided at a portion of the primary molded portion 26 different to the portion where the inner terminal portions 29 and the outer terminal portions 30 are provided.

The inner terminal portions 29, the outer terminal portions 30, and the exposed portions 35 can be held by a die, and thus, when molding the secondary molded portion 27, the primary molded portion 26 and the bus bars 25 can be further kept from shifting.

With the present embodiment, each inner terminal portion 29 extends upward relative to the plate surface of the corresponding bus bar 25, each outer terminal portion 30 extends downward relative to the plate surface of the corresponding bus bar 25, and the exposed portions 35 and the outer terminal portions 30 closer to the exposed portions 35 are arranged on opposite sides to each other relative to the plate surfaces of the bus bars 25.

When molding the secondary molded portion 27, the primary molded portion 26 can be kept from being subjected to an angular moment by the molten synthetic resin.

In the circuit unit 10 according to the present embodiment, the terminal portions include the inner terminal portions 29 that are disposed inside the case 11 and connected to the circuit portion 12, and the outer terminal portions 30 that are disposed outside the case 11 and connected to an external circuit.

The external circuit disposed outside the case 11 and the circuit portion 12 inside the case 11 can be electrically connected in a water-proof state by the lower case 15 included in the case 11.

Embodiment 2

Figure 13:
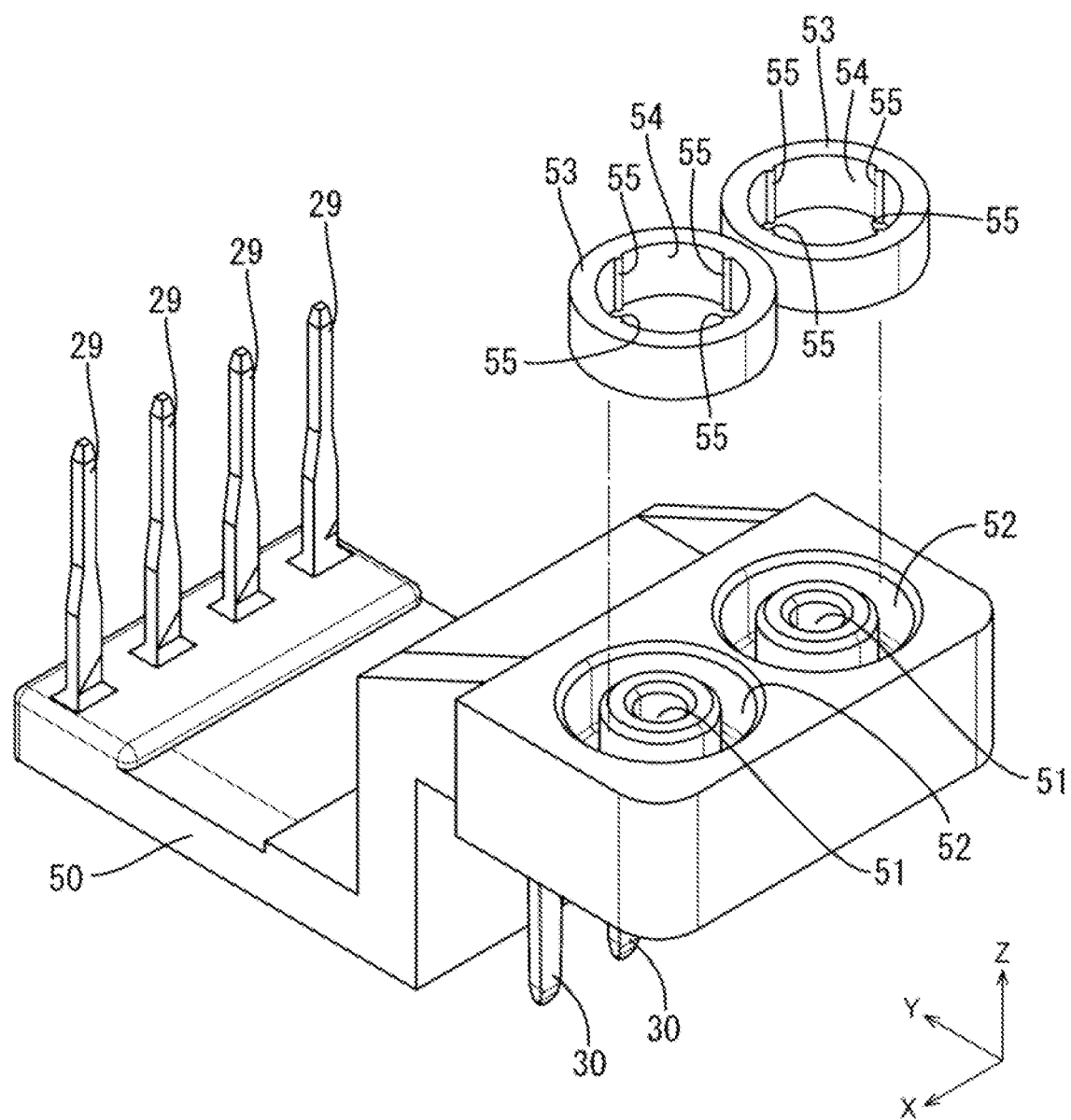
FIG. 13 is an exploded perspective view showing a seal member and a primary molded portion according to Embodiment 2.

Next, Embodiment 2 of the present disclosure will be described with reference to FIG. 13. A primary molded portion 50 according to the present embodiment is provided with two exposed portions 51. The primary molded portion 50 is provided with housing cavities 52 that have an annular shape as seen from above, around the exposed portions 51, respectively.

Each housing cavity 52 is configured such that an annular seal member 53 can be press-fitted into it from above. The internal shapes of the housing cavities 52 are formed substantially the same as the outer shapes of the seal members 53.

A through-hole 54 is formed extending through each seal member 53 in the vertical direction thereof. The inner surface of each of the through-holes 54 is provided with press-fitting ribs 55 that extend in the vertical direction and protrude inward. A plurality (four in the present embodiment) of press-fitting ribs 55 are provided in each through-hole 54, spaced apart from each other in the circumferential direction of the through-hole 54. In the present embodiment, the press-fitting ribs 55 are arranged equidistant from each other.

Configurations other than those described above are substantially the same as those of Embodiment 1, and thus like reference numerals are given to like members and redundant descriptions are omitted.

With the present embodiment, the seal members 53 are respectively disposed in the housing cavities 52 provided at the circumference of the exposed portions 51, and thus water can be further kept from entering via the exposed portions 51.

Embodiment 3

Figure 14:
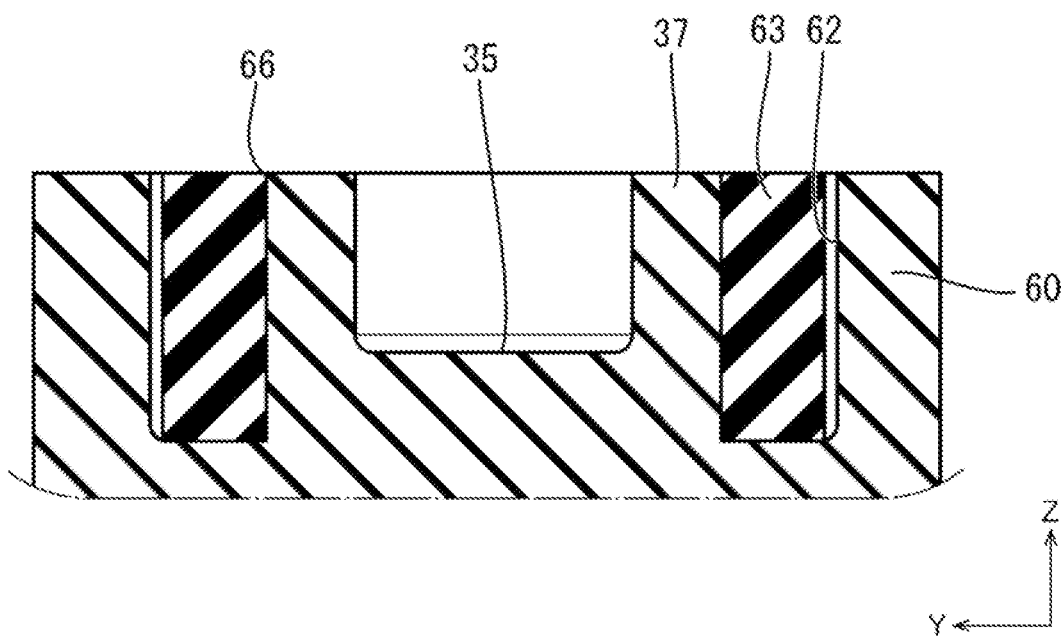
FIG. 14 is a partial enlarged cross-sectional diagram showing the seal member attached to the primary molded portion according to Embodiment 2.

Next, Embodiment 3 of the present disclosure will be described with reference to FIGS. 14 and 15. As shown in FIG. 14, in a state where a seal member 63 is housed in a housing cavity 62 of a primary molded portion 60, a gap is formed between the outer circumferential surface of the seal member 63 and the wall surface in the housing cavity 62. Accordingly, the workability when housing the seal member 63 in the housing cavity 62 is improved. The opening edge portion of each housing cavity 62 according to the present embodiment is not provided with an inclined surface. Accordingly, the opening edge portion of each housing cavity 62 has an angular corner portion 66.

Figure 15:
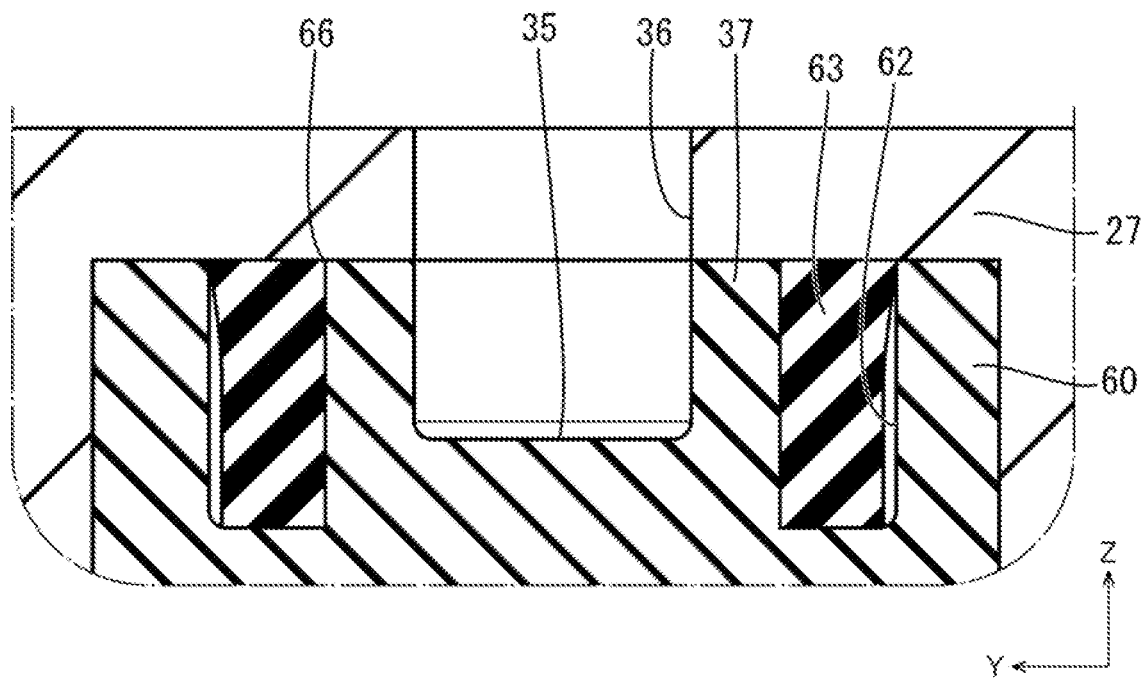
FIG. 15 is a partial enlarged cross-sectional diagram showing a boundary portion between the seal member and a secondary molded portion.

As shown in FIG. 15, once the secondary molding has been performed, the upper edge of each seal member 63 is melted by molten thermoplastic resin, and marginally drifts under the pressure of the molten thermoplastic resin. Accordingly, the opening edge portion of each housing cavity 62 is closed off by the upper edge of the corresponding seal member 63. Furthermore, the upper edges of the seal members 63 and the thermoplastic resin forming the secondary molded portion 27 are in a heat sealed state, and thus the water-proofness between the primary molded portion 60 and the secondary molded portion 27 can be improved.

Configurations other than those described above are substantially the same as those of Embodiment 1, and thus like reference numerals are given to like members and redundant descriptions are omitted.

Embodiment 4

Figure 16:
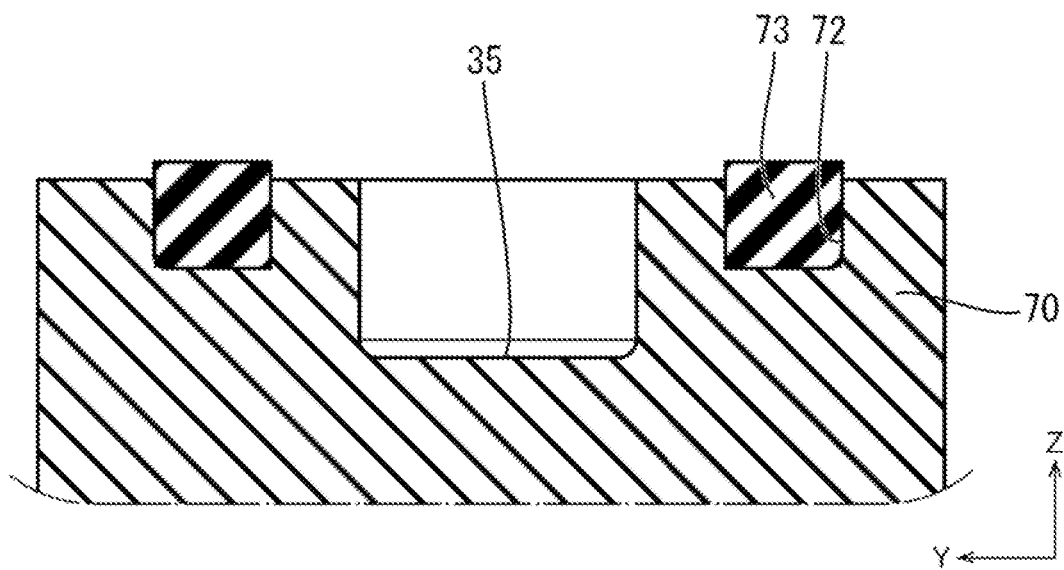
FIG. 16 is a partial enlarged cross-sectional diagram showing the seal member attached to a primary molded portion according to Embodiment 3.
Figure 17:
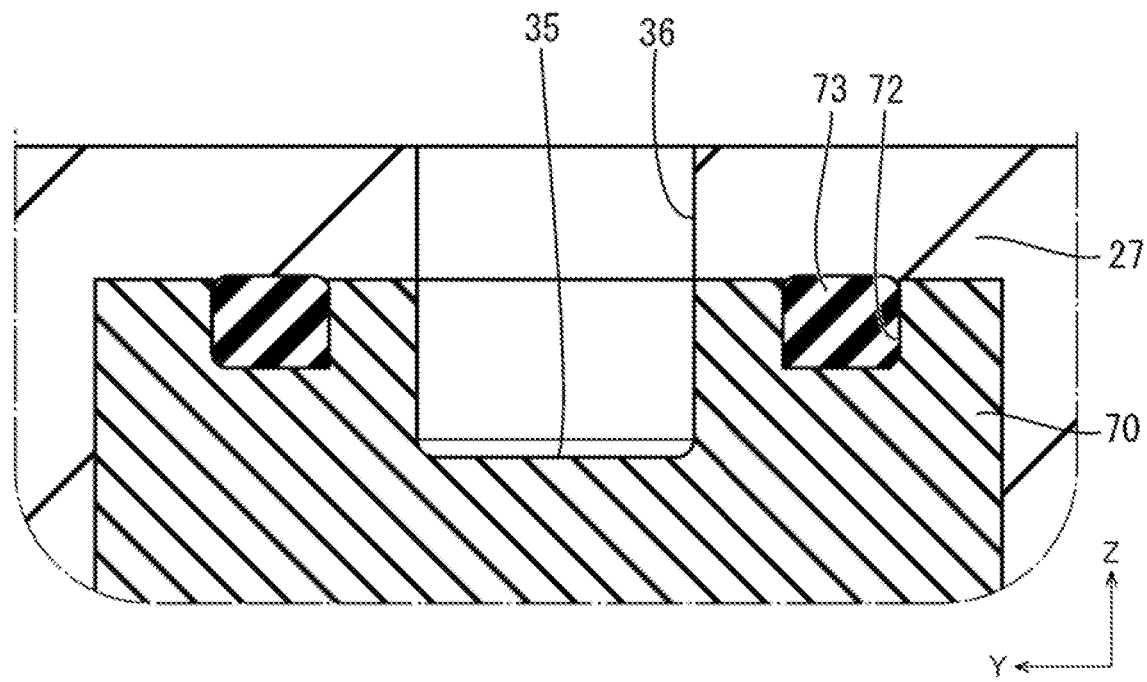
FIG. 17 is a partial enlarged cross-sectional diagram showing a boundary portion between the seal member and the secondary molded portion.

Next, Embodiment 4 according to the present disclosure will be described with reference to FIGS. 16 and 17. As shown in FIG. 16, the depth of each housing cavity 72 provided in a primary molded portion 70 from the upper side of the primary molded portion 70 is set smaller than the height of seal members 73 in the vertical direction. Accordingly, when a seal member 73 is press-fitted into a housing cavity 72 from above, the upper edge of the seal member 73 protrudes upward past the upper side of the primary molded portion 70.

Then, when secondary molding is performed, the upper edges of the seal members 73 are melted by molten thermoplastic resin, and drift under the pressure of the thermal thermoplastic resin. Accordingly, the upper edges of the seal members 73 are brought to substantially the same height as the upper surface of the primary molded portion 70 (see FIG. 17). In this state, the upper edges of the seal members 73 and the secondary molded portion 27 are heat sealed to each other, and thus the water-proofness between the primary molded portion 70 and the secondary molded portion 27 can be improved.

Configurations other than those described above are substantially the same as those of Embodiment 1, and thus like reference numerals are given to like members and redundant descriptions are omitted.

Embodiment 5

Figure 18:
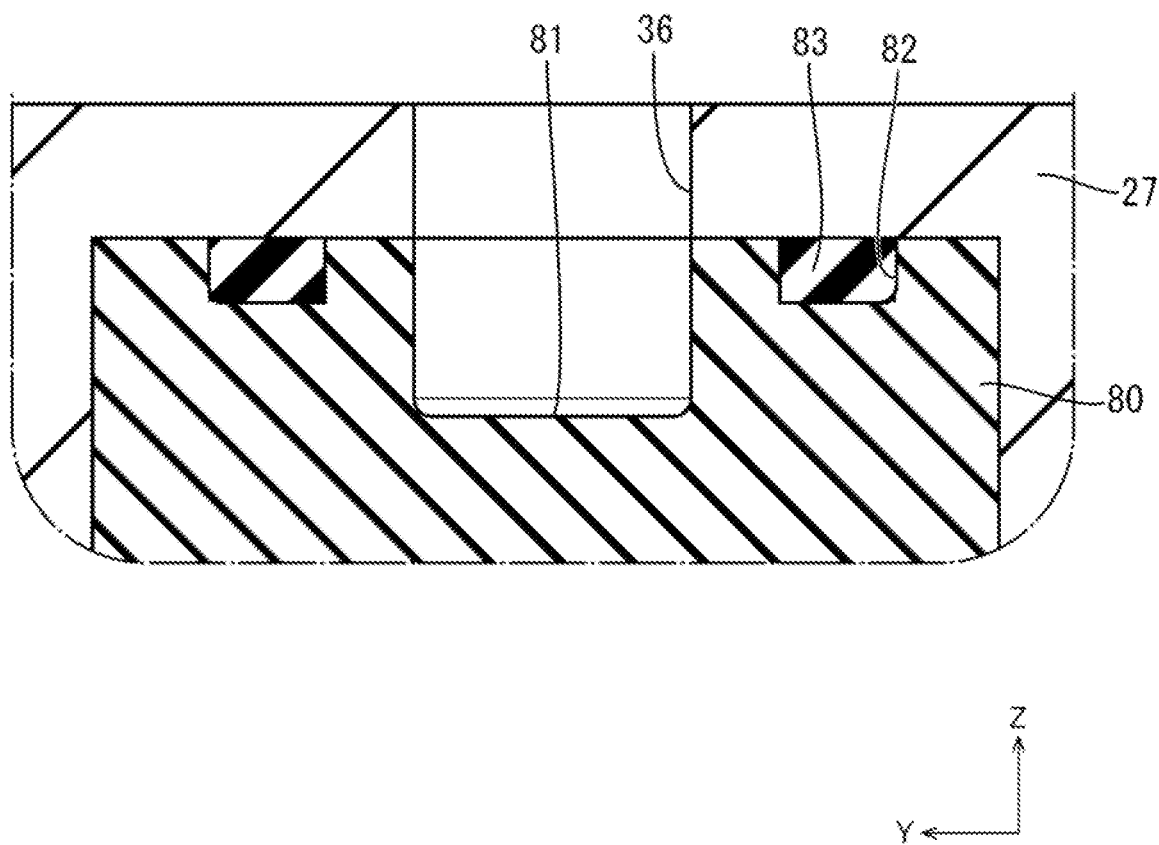
FIG. 18 is a partial enlarged cross-sectional diagram showing a boundary portion between a seal member and a secondary molded portion according to Embodiment 4.

Next, Embodiment 5 according to the present disclosure will be described with reference to FIG. 18. In a primary molded portion 80 according to the present embodiment, the vertical height of a seal member 83 and the depth of a housing cavity 82 from the upper side of the primary molded portion 80 are set to be the same. Accordingly, in a state where a seal member 83 is press-fitted into a housing cavity 82 from above, the upper side of the seal member 83 and the upper side of the primary molded portion 80 are substantially flush.

Then, secondary molding is performed, and the upper edges of the seal members 83 and the secondary molding portion 27 are heat sealed to each other. With the present embodiment, the upper edges of the seal members 83 melt during the secondary molding but do not drift. Thus, a melted and drifting seal member 83 can be kept from protruding into an exposed portion 81 from a boundary portion between the primary molded portion 80 and the secondary molded portion 27.

Configurations other than those described above are substantially the same as those of Embodiment 1, and thus like reference numerals are given to like members and redundant descriptions are omitted.

Embodiment 6

Figure 19:
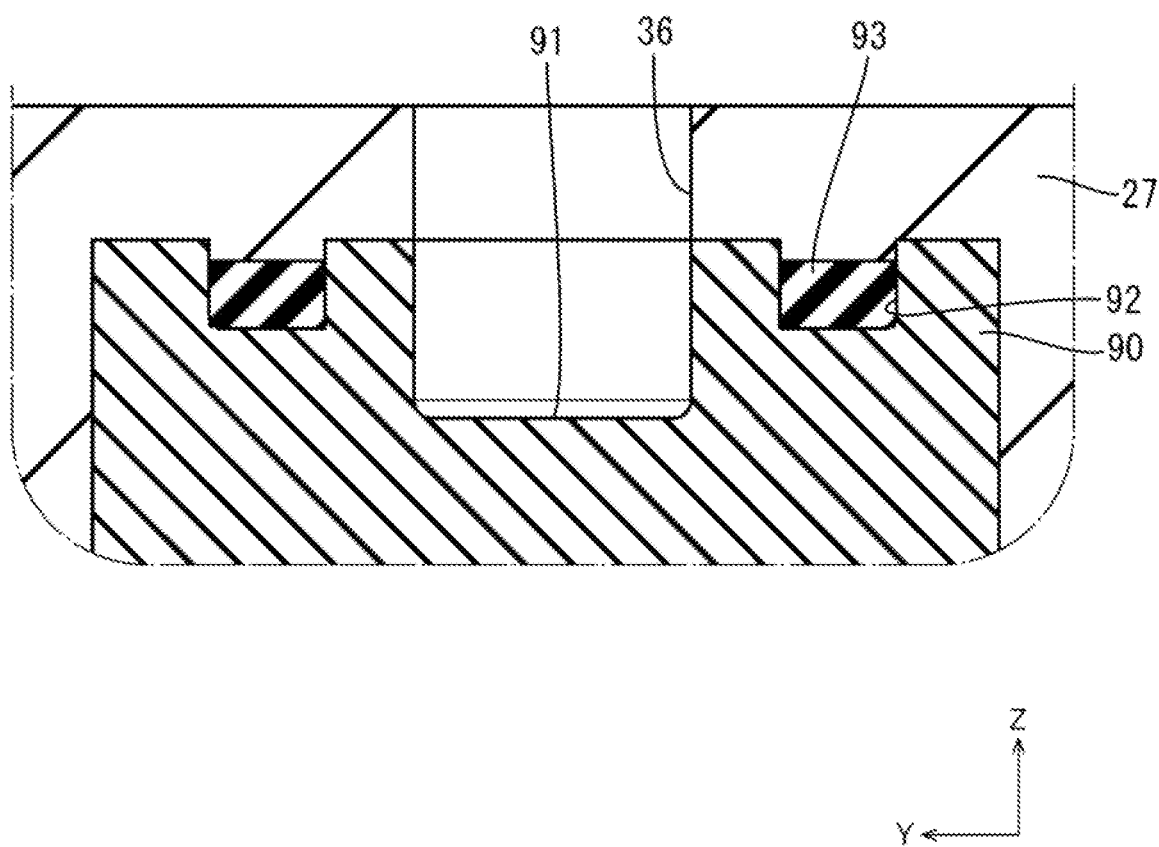
FIG. 19 is a partial enlarged cross-sectional diagram showing a boundary portion between a seal member and a secondary molded portion according to Embodiment 5.

Next, Embodiment 6 according to the present disclosure will be described with reference to FIG. 19. As shown in FIG. 19, the depth of a housing cavity 92 provided in a primary molded portion 90 from the upper side of the primary molded portion 90 is set greater than the vertical height of a seal member 93. Accordingly, when a seal member 93 is press-fitted into a housing cavity 92 from above, the upper edge of the seal member 93 is located at a position lower than the upper side of the primary molded portion 90.

Then, when secondary molding is performed, molten thermoplastic resin enters the housing cavity 92 and comes into contact with the upper edge of the seal member 93. Then, the upper edge of the seal member 93 melts, and the upper edge of the seal member 93 and the secondary molded portion 27 are heat sealed to each other. With the present embodiment, during secondary molding, the upper edge of the seal member 93 is kept from melting and drifting. Thus, a melted and drifting seal member 93 can be kept from protruding into an exposed portion 91 from a boundary portion between the primary molded portion 90 and the secondary molded portion 27.

Configurations other than those described above are substantially the same as those of Embodiment 1, and thus like reference numerals are given to like members and redundant descriptions are omitted.

Other Embodiments

An embodiment in which the electric connection member is applied to the connector portion 28 provided on the lower case 15 was described as an example, but the present disclosure is not limited to this, and the electric connection member may also be applied to a connector in which bus bars 25 are molded using a synthetic resin material, or may be applied to any electric connection member.

A configuration may also be employed where one exposed portion is provided in the primary molded portion, and one seal member surrounds the circumference of the exposed portion. If such a configuration is employed, the step of attaching the seal member to the primary molded portion can be made simpler.

A configuration may also be employed where the primary molded portion is provided with three or more exposed portions. In this case, one or two or more seal members may be provided. The number of portions of the primary molded portion supported by support portions increases as the number of exposed portions increases, and thus the primary molded portion is less likely to shift during secondary molding.

A configuration may also be employed where press-fitting ribs protrude from a wall surface of a housing cavity and the press-fitting ribs abut against the seal member. Also a configuration in which the press-fitting ribs are omitted may be employed.

One bus bar may also have three or more terminal portions.

What is claimed is:

1. An electric connection member comprising:
   a bus bar that has at least one terminal portion;
   a primary molded portion formed from a thermoplastic resin and formed in one piece with the bus bar in a state where the terminal portion is exposed;
   a secondary molded portion formed from a thermoplastic resin and formed in one piece with the primary molded portion so as to be a unitary piece; and
   a seal member embedded in the secondary molded portion,
   wherein the primary molded portion includes a pair of circumferential walls spaced apart from each other, each of the circumferential walls bounding an exposed portion that is exposed from an opening portion provided in the secondary molded portion,
   the seal member is shaped to surround the circumference of each of the pair of circumferential walls without a gap, and
   a boundary portion of the seal member to the secondary molded portion is heat sealed to the secondary molded portion; wherein the secondary molded portion covers the primary molded portion so as to enclose the seal member and the pair of circumferential walls.

2. The electric connection member according to claim 1, wherein the primary molded portion has a housing cavity that is formed in the shape of a recess and surrounds the circumference of the exposed portion, and
   the seal member is disposed in the housing cavity.

3. The electric connection member according to claim 2, wherein one of the seal member and a wall surface of the housing cavity is provided with a press-fitting rib protruding toward the other of the seal member and the wall surface of the housing cavity, and
   the press-fitting rib comes into contact with the other of the seal member and the wall surface of the housing cavity.

4. The electric connection member according to claim 3, wherein the bus bar has at least two end portions,
   the two end portions are each provided with a terminal portion, and
   the exposed portion is provided in a portion of the primary molded portion that is different to where the terminal portions of the two end portions are provided.

5. The electric connection member according to claim 2, wherein the bus bar has at least two end portions,
   the two end portions are each provided with a terminal portion, and
   the exposed portion is provided in a portion of the primary molded portion that is different to where the terminal portions of the two end portions are provided.

6. The electric connection member according to claim 1, wherein the bus bar has at least two end portions,
   the two end portions are each provided with a terminal portion, and
   the exposed portion is provided in a portion of the primary molded portion that is different to where the terminal portions of the two end portions are provided.

7. The electric connection member according to claim 6, wherein the terminal portions respectively provided at the two end portions extend in opposite directions relative to a plate surface of the bus bar, and
   the exposed portion and the terminal portion of the terminal portions respectively provided at the two end portions closer to the exposed portion are disposed on opposite sides relative to the plate surface of the bus bar.

8. A circuit unit comprising:
   a case including the electric connection member according to claim 1; and
   a circuit portion housed in the case.

9. The circuit unit according to claim 8, wherein the terminal portion includes an inner terminal portion disposed in the case and connected to the circuit portion, and an outer terminal portion disposed outside of the case and configured to be connected to an external circuit.

10. The circuit unit according to claim 8, wherein the primary molded portion has a housing cavity that is formed in the shape of a recess and surrounds the circumference of the exposed portion, and
    the seal member is disposed in the housing cavity.

11. The circuit unit according to claim 10, wherein one of the seal member and a wall surface of the housing cavity is provided with a press-fitting rib protruding toward the other of the seal member and the wall surface of the housing cavity, and
    the press-fitting rib comes into contact with the other of the seal member and the wall surface of the housing cavity.

12. The circuit unit according to claim 8, wherein the bus bar has at least two end portions,
    the two end portions are each provided with a terminal portion, and
    the exposed portion is provided in a portion of the primary molded portion that is different to where the terminal portions of the two end portions are provided.

13. The circuit unit according to claim 8, wherein the terminal portions respectively provided at the two end portions extend in opposite directions relative to a plate surface of the bus bar, and
    the exposed portion and the terminal portion of the terminal portions respectively provided at the two end portions closer to the exposed portion are disposed on opposite sides relative to the plate surface of the bus bar.

* * * * *